(12) United States Patent
Shiomichi et al.

(10) Patent No.: US 10,714,527 B2
(45) Date of Patent: Jul. 14, 2020

(54) PHOTOELECTRIC CONVERSION APPARATUS, SENSOR UNIT, AND IMAGE FORMING APPARATUS

(71) Applicant: CANON KABUSHIKI KAISHA, Tokyo (JP)

(72) Inventors: Hirotaka Shiomichi, Yokohama (JP); Wataru Endo, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 345 days.

(21) Appl. No.: 15/891,605

(22) Filed: Feb. 8, 2018

(65) Prior Publication Data

US 2018/0254298 A1 Sep. 6, 2018

(30) Foreign Application Priority Data

Mar. 1, 2017 (JP) .................. 2017-038679

(51) Int. Cl.
*H01L 27/146* (2006.01)
*H01L 31/14* (2006.01)
(Continued)

(52) U.S. Cl.
CPC ........ *H01L 27/14636* (2013.01); *H01L 31/14* (2013.01); *H04N 1/191* (2013.01);
(Continued)

(58) Field of Classification Search
CPC ......... H01L 27/14636; H01L 27/14607; H01L 27/14603; H01L 27/14601; H01L 27/146; H01L 27/14643; H01L 27/148; H01L 27/14806; H01L 27/14812; H01L 31/14; H04N 5/378; H04N 5/369; H04N 5/3694; H04N 5/361; H04N 5/357; H04N 5/3742; H04N 5/374; H04N 2201/0082; H04N 1/191

See application file for complete search history.

(56) References Cited

U.S. PATENT DOCUMENTS

| 6,091,449 A * | 7/2000 | Matsunaga ....... H01L 27/14643 257/292 |
| 2010/0283880 A1* | 11/2010 | Kobayashi ........... H04N 5/3595 348/300 |

(Continued)

FOREIGN PATENT DOCUMENTS

JP S58-206280 A 12/1983

*Primary Examiner* — John R Lee
(74) *Attorney, Agent, or Firm* — Venable LLP (57) ABSTRACT

A photoelectric conversion apparatus is provided. The apparatus comprises a substrate including two light receiving regions in which light receiving devices are arranged; electrode pads arranged on the substrate; and a readout circuit arranged on the substrate and configured to read out signals from the light receiving regions. The electrode pads include an output pad for outputting a signal, and a power supply pad for supplying power to the light receiving regions or the readout circuit. Each of the light receiving regions has a shape in which a first direction is taken as a longitudinal direction, the light receiving regions are arranged along a second direction with an interval therebetween, the second direction intersecting the first direction, and one or more pads of the electrode pads is sandwiched by the light receiving regions in the second direction.

19 Claims, 8 Drawing Sheets (51) Int. Cl.
*H04N 5/378* (2011.01)
*H04N 5/374* (2011.01)
*H04N 5/361* (2011.01)
*H04N 5/369* (2011.01)
*H04N 1/191* (2006.01)

(52) U.S. Cl.
CPC ........... *H04N 5/361* (2013.01); *H04N 5/3694* (2013.01); *H04N 5/378* (2013.01); *H04N 5/3742* (2013.01); *H04N 2201/0082* (2013.01)

(56) References Cited

U.S. PATENT DOCUMENTS

2018/0234652 A1* 8/2018 Sugawa .................. H04N 5/378
2018/0254298 A1* 9/2018 Shiomichi .............. H04N 5/361
2018/0281390 A1* 10/2018 Fujii ................. H01L 27/11206

* cited by examiner

PHOTOELECTRIC CONVERSION APPARATUS, SENSOR UNIT, AND IMAGE FORMING APPARATUS

BACKGROUND OF THE INVENTION

Field of the Invention

The present invention relates to a photoelectric conversion apparatus, a sensor unit, and an image forming apparatus.

Description of the Related Art

A proposal has been made for reducing chip area in a photoelectric conversion apparatus in which a light receiving device region, which is configured by a plurality of light receiving devices for converting incident light into an electrical signal, and a peripheral circuit, which is for processing of the electrical signal outputted from the light receiving device region and performing control of the light receiving device region, are formed on a substrate. Japanese Patent Laid-Open No. 58-206280 describes a solid-state linear image sensor that includes a light receiving device region in which light receiving devices line up with an X direction as a longer side, and a peripheral circuit arranged following an arrangement direction of the light receiving devices. By arranging electrode pads outside, in the X direction, of the peripheral circuit and the light receiving device region in a region that does not protrude from an extension in the X direction of the light receiving device region and the peripheral circuit, and shortening the length of the chip in a Y direction that orthogonal to the X direction, a chip area is reduced.

SUMMARY OF THE INVENTION

In a photoelectric conversion apparatus, there are cases where two light receiving device regions are arranged on a substrate, such as a case in which incident light is narrowed by two opening portions and separately received, or a case where a light emission device having high directionality is used and an emitted light ray that is divided into two is received. In this way, in an optical system where incident light is divided into two, there is a need to space two light receiving device regions arranged on the same substrate by a predetermined distance in order to avoid mutual interference. In the case where the arrangement of electrode pads described in Japanese Patent Laid-Open No. 58-206280 is applied to a photoelectric conversion apparatus in which two light receiving device regions are arranged by a predetermined interval, the chip size of the photoelectric conversion apparatus may increase in size because electrode pads are arranged outside of the peripheral circuit and the light receiving device region.

Some embodiments of the present invention provide a technique advantageous in miniaturizing a chip size in a photoelectric conversion apparatus in which a plurality of light receiving device regions and a peripheral circuit are arranged on the same substrate.

According to some embodiments, a photoelectric conversion apparatus, comprising: a substrate including two light receiving device regions in each of which a plurality of light receiving devices are respectively arranged; a plurality of electrode pads arranged on the substrate; and a readout circuit arranged on the substrate and configured to read out signals from the two light receiving device regions, wherein the plurality of electrode pads include an output pad for outputting a signal from the readout circuit, and a power supply pad for supplying power to one of the two light receiving device regions and the readout circuit, each of the two light receiving device regions has a shape in which a first direction is taken as a longitudinal direction, the two light receiving device regions are arranged along a second direction with an interval therebetween, the second direction intersecting the first direction, and one or more electrode pads of the plurality of electrode pads is sandwiched by the two light receiving device regions in the second direction, is provided.

According to some other embodiments, a photoelectric conversion apparatus, comprising: a plurality of first photoelectric conversion units arranged to form a first column along a line in a first direction; a plurality of second photoelectric conversion units arranged to form a second column along a line in the first direction; a readout circuit arranged, in a second direction that intersects the first direction, between the second column and the first column which are arranged in the second direction and configured to read out signals from the plurality of first photoelectric conversion units and a signal from the plurality of second photoelectric conversion units; and a plurality of electrode pads arranged, in the second direction, between the first column and the second column, wherein a virtual line connecting any one of the plurality of first photoelectric conversion units and any one of the plurality of second photoelectric conversion units passes through one or more of the plurality of electrode pads, is provided.

Further features of the present invention will become apparent from the following description of exemplary embodiments (with reference to the attached drawings).

DESCRIPTION OF THE EMBODIMENTS

Specific embodiments of a photoelectric conversion apparatus according to the present invention will be described hereinafter, with reference to the attached drawings. Note that, in the following description and the drawings, the same reference numerals are given to configurations that are the same across a plurality of drawings. Accordingly, common configurations are described with mutual reference to the plurality of drawings, and description of configurations to which common reference numerals are given is abbreviated as appropriate.

Figure 1:
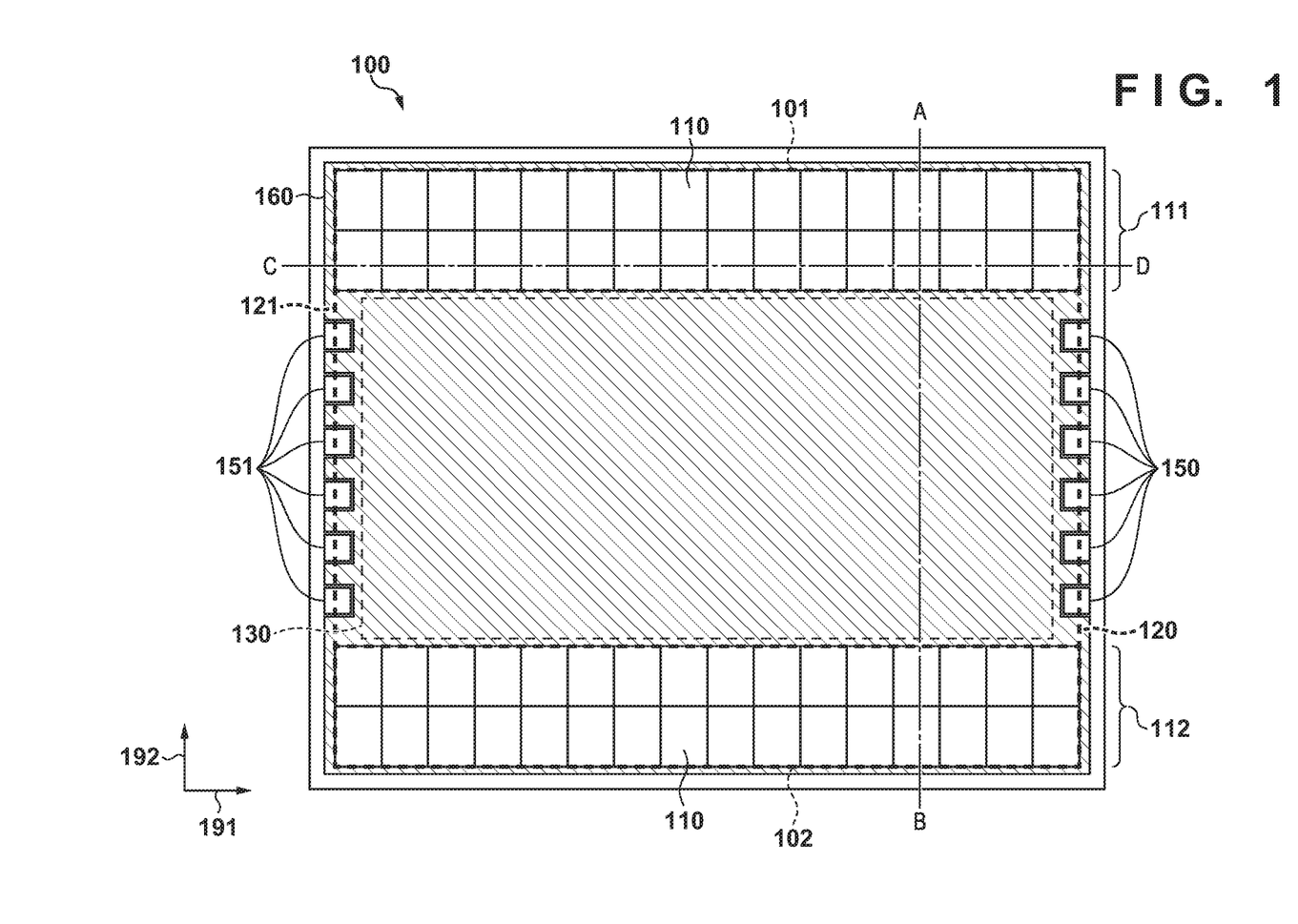
FIG. 1 is a plan view of a photoelectric conversion apparatus according to embodiments of the present invention.

With reference to FIGS. 1 through 6, explanation is given regarding a configuration of a photoelectric conversion apparatus according to an embodiment of the present invention. FIG. 1 is a plan view that illustrates a configuration of a photoelectric conversion apparatus 100 in the embodiment of the present invention. The photoelectric conversion apparatus 100 includes a semiconductor substrate on which two light receiving device arrays 111 and 112 are arranged. In addition, the photoelectric conversion apparatus 100 includes a readout circuit 130 arranged on the substrate, and a plurality electrode pads 150 and 151 and a light blocking portion 160 which are arranged on substrate, and arrangement is all on one chip.

The light receiving device array 111 includes a light receiving device region 101 in which a plurality of light receiving devices 110 are arranged so as to have a shape whose longitudinal direction is parallel with a direction 191 illustrated in FIG. 1. Similarly, the light receiving device array 112 includes a light receiving device region 102 in which a plurality of light receiving devices 110 are arranged so as to have a shape whose longitudinal direction is parallel with the direction 191. The light receiving device region 101 and the light receiving device region 102 are each arranged to face each other across a predetermined interval in a direction 192 which intersects the direction 191. The direction 191 and the direction 192 may be orthogonal as illustrated in FIG. 1. In the present embodiment, each of the light receiving device regions 101 and 102 has a rectangular shape in which a total of 32 light receiving devices 110 are arranged in a two-dimensional array shape, with 16 running parallel to the direction 191 by two running parallel to the direction 192. The number or arrangement of the light receiving devices 110 included in each of the light receiving device regions 101 and 102 is not limited to this and may be appropriately decided based on a specification of a photoelectric conversion apparatus. For example, for the light receiving device regions 101 and 102, a plurality of the light receiving devices 110 may have a staggered arrangement with the direction 191 taken as a longitudinal direction. The interval in the direction 192 for the two light receiving device regions 101 and 102 may be, for example, a distance two times or more or five times or more with respect to a size in the direction 192 of the light receiving device regions 101 and 102, in order to avoid mutual interference due to light incident on the light receiving device regions 101 and 102.

The electrode pads 150 and 151 are electric contacts that are exposed in order to electrically connect with units external to the photoelectric conversion apparatus 100. The electrode pads 150 and 151 include an output pad for outputting a signal from the readout circuit 130, and a power supply pad for supplying power to one of the readout circuit 130 and the two light receiving device regions 101 and 102. As illustrated in FIG. 1, for the electrode pads 150 and 151, a plurality of electrode pads are arranged in a single column that runs parallel to the direction 192 at both ends in the direction 191 of the photoelectric conversion apparatus 100. With the configuration illustrated in FIG. 1, six electrode pads are arranged for each of the electrode pads 150 and 151. The electrode pads 150 and 151 are sandwiched by the two light receiving device regions 101 and 102 as illustrated in FIG. 1. More specifically, each of the electrode pads 150 and 151 is arranged between the light receiving device regions 101 and 102 and runs in the direction 192. Furthermore, for the electrode pads 150 and 151, at least portions of the electrode pads 150 and 151 are respectively arranged across, in the direction 191, virtual lines 120 and 121 which connect the edge portions of the light receiving device regions 101 and 102 in the direction 191 and the direction opposite to the direction 191 to each other. Accordingly, in each of the electrode pads 150 and 151, at least a part of a side following the direction 191 out of the outer edges of the electrode pads 150 and 151 is arranged in a region (between the virtual line 120 and the virtual line 121) sandwiched by the two light receiving device regions 101 and 102. For example, configuration may be taken such that a portion of the electrode pads 150 and 151 is arranged between the two light receiving device regions 101 and 102 in the direction 192 so that all of the electrode pads 150 and 151 is divided into two portions by the virtual line 120 or the virtual line 121. In addition, every respective electrode pad of the electrode pads 150 and 151 may be arranged in the region (between the virtual line 120 and the virtual line 121) sandwiched by the two light receiving device regions 101 and 102. As illustrated by FIG. 1, the virtual line 120 connects edges of the outer edge of, out of the light receiving devices 110, two light receiving devices 110 arranged at the edge portion on the same side in the direction 191 which is a longitudinal direction of the two light receiving device regions 101 and 102 to each other. In addition, the virtual line 121 connects to each other the outer edges of two of the light receiving devices 110 that are arranged at the edge portions of the two light receiving device regions 101 and 102 on the side opposite to the virtual line 120 in the direction 191.

The readout circuit 130 is arranged within the region sandwiched by the two light receiving device regions 101 and 102. More specifically, the readout circuit 130 is arranged between the virtual line 120 and the virtual line 121 in the direction 191, and between the two light receiving device regions 101 and 102 in the direction 192. In addition, with the configuration illustrated in FIG. 1, in the photoelectric conversion apparatus 100, the plurality of electrode pads 150 are arranged on a side further in the direction 191 than the readout circuit 130, in other words on the side in the direction 191 starting from the readout circuit 130 (the virtual line 120 side). In addition, in the photoelectric conversion apparatus 100, the plurality of electrode pads 151 are arranged on a side further in a direction opposite the direction 191 from the readout circuit 130, in other words on the side in the opposite direction of the direction 191 starting from the readout circuit 130 (the virtual line 121 side). The electrode pads 151 are arranged on a side opposite, in the direction 191 starting from the readout circuit 130, to the side where the electrode pads 150 are arranged. In the present embodiment, the electrode pads 150 and 151 are respectively arranged on the two sides of the readout circuit 130, but configuration may be taken to have an arrangement on only one side. For example, configuration may be taken such that only the electrode pads 150 are arranged on the side closer to the virtual line 120 from the readout circuit 130, or such that only the electrode pads 151 are arranged on the side closer to the virtual line 121 from the readout circuit 130.

In accordance with the above configuration, in comparison to a case where the electrode pads 150 and 151 are arranged on the outer circumference of the chip of the photoelectric conversion apparatus 100, it is possible to accommodate the size of the photoelectric conversion apparatus 100 to a chip size decided in accordance with the arrangement of the two light receiving device regions 101 and 102.

Here, if the two light receiving device regions 101 and 102 are arranged at the same position in the direction 191 with the same size mutually as illustrated in FIG. 1, the virtual lines 120 and 121 can extend parallel to the direction 192 following the direction 192. If the light receiving device region 101 and the light receiving device region 102 have different sizes or if they are arranged shifted in the direction 191, the virtual lines 120 and 121 can take any angle with respect to the direction 191 and the direction 192. In such a case, the edge portions of the light receiving device region 101 may be corners on the light receiving device region 102 side in the direction 192 that are respectively edge portions in the direction 191 and the direction opposite the direction 191 of the two light receiving devices 110 arranged on the edge portions of the light receiving device region 101 in the direction 191 and the direction opposite the direction 191. Similarly, the edge portions of the light receiving device region 102 may be corners on the light receiving device region 101 side in the direction 192 that are respectively edge portions in the direction 191 and the direction opposite the direction 191 of the two light receiving devices 110 arranged on the edge portions of the light receiving device region 102 in the direction 191 and the direction opposite the direction 191.

The light blocking portion 160 is configured by using a wiring line pattern layer, for example. The light blocking portion 160 can be arranged so as to cover the photoelectric conversion apparatus 100, excluding portions above the electrode pads 150 and 151 and above respective light receiving devices 110 of the light receiving device regions 101 and 102. Accordingly, the light blocking portion 160 can cover the readout circuit 130.

Figure 2:
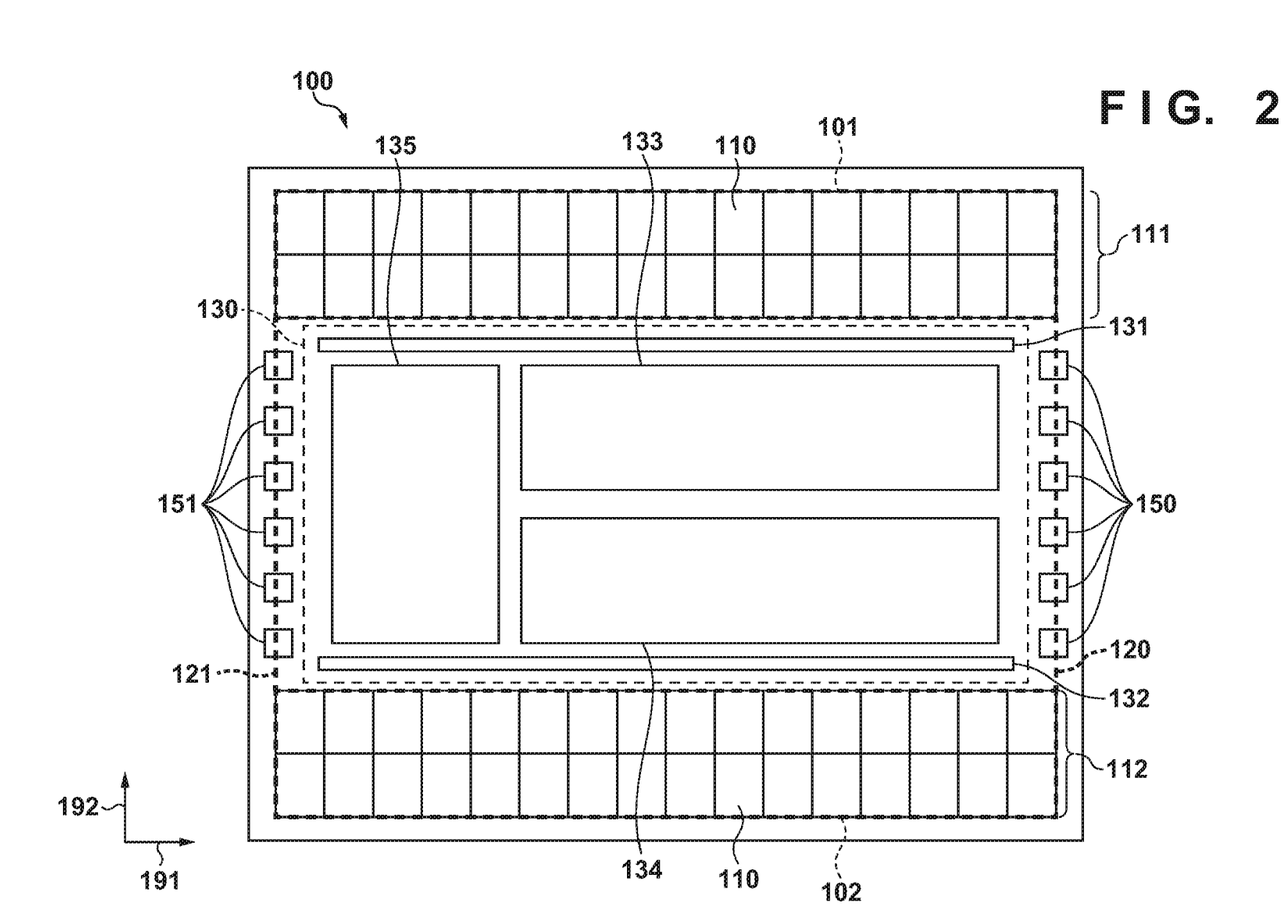
FIG. 2 is a plan view of the photoelectric conversion apparatus of FIG. 1.
Figure 3A:
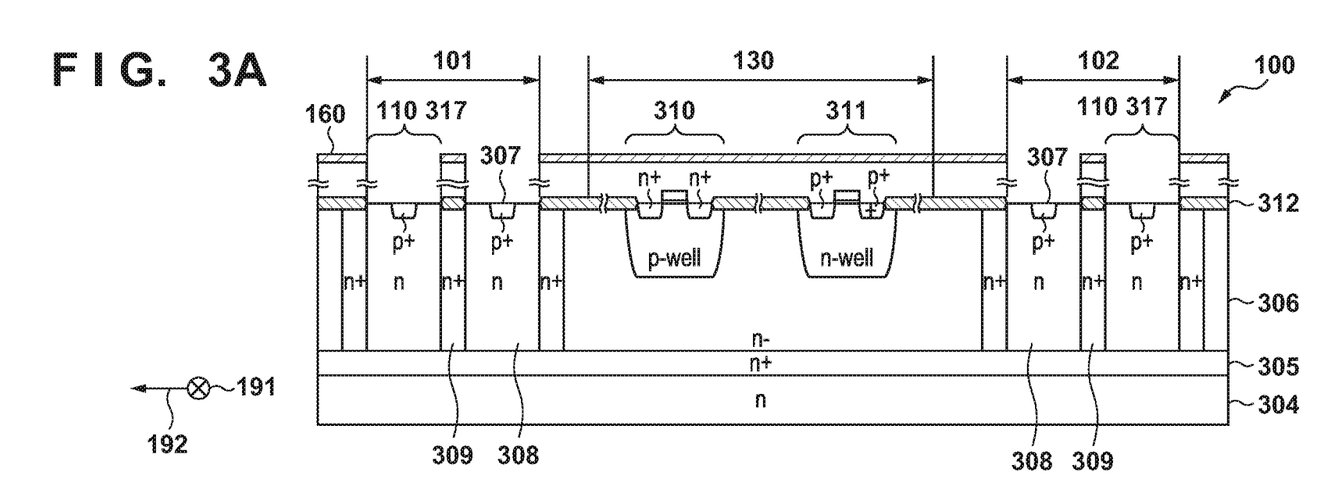
FIGS. 3A and 3B are cross-sectional views of the photoelectric conversion apparatus of FIG. 1.
Figure 3B:
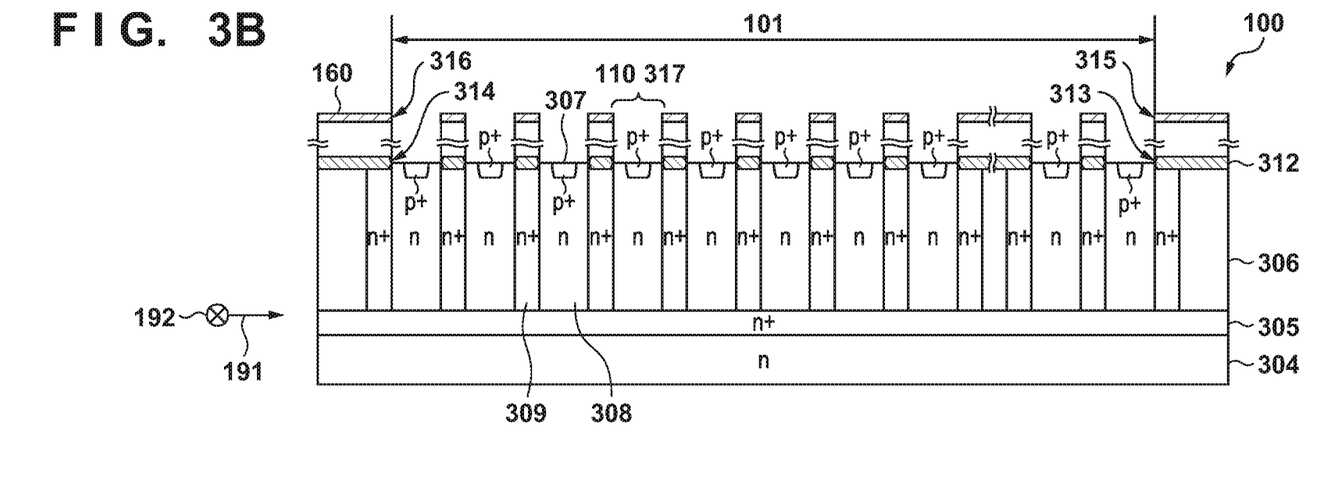

Next, using FIGS. 2 through 5, explanation is given regarding operation and a more detailed configuration of the photoelectric conversion apparatus 100. FIG. 2 is a plan view of a lower layer of the photoelectric conversion apparatus 100 illustrated in FIG. 1, excluding the light blocking portion 160. FIG. 3A is a cross-sectional view between A-B in FIG. 1, and FIG. 3B is a cross-sectional view between C-D in FIG. 1. The readout circuit 130 includes a selecting unit 135, processing units 133 and 134, and selection units 131 and 132, in order to read signals of respective light receiving devices 110 of the two light receiving device regions 101 and 102. Detail of operation of the readout circuit 130 is described later. In the present embodiment, as illustrated in FIGS. 3A and 3B, for the photoelectric conversion apparatus 100, an n+ type buried layer 305 and an n− type epitaxial layer 306 are stacked on a substrate 304 which is an n type semiconductor. The readout circuit 130 configured by an nMOS transistor 310, a pMOS transistor 311, and the like, and the light receiving device regions 101 and 102 are formed on the surface of the n− type epitaxial layer 306.

Each light receiving device 110 of the light receiving device regions 101 and 102 includes a photoelectric conversion unit configured by a PN type photodiode, for example. Accordingly, it can be said that, in each of the two light receiving device regions 101 and 102, a plurality of photoelectric conversion units are arranged so as to form an array following the direction 191. The PN type photodiode is configured by a p+ type region 307 and an n type region 308 formed in the epitaxial layer 306, and n+ type barrier regions 309 are arranged around the region 307 and the region 308. Respective light receiving devices 110 are electrically separated by the barrier regions 309 and element isolation regions 312 which uses an insulating material such as silicon oxide. In other words, each light receiving device 110 includes regions 307 and 308 (a photoelectric conversion unit) which are semiconductor regions arranged in an active region defined by the element isolation regions 312 and the barrier regions 309. Accordingly, boundaries between the light receiving devices 110 (active regions) and the element isolation regions 312 can be outer edges of respective light receiving devices 110. In addition, the virtual line 120 described above can pass through a boundary 313 between the element isolation regions 312 and light receiving devices 110 arranged closest to respective single edges of the light receiving device regions 101 and 102, in the direction 191. Similarly, the virtual line 121 described above can pass through a boundary 314 between the element isolation regions 312 and light receiving devices 110 arranged closest to the other respective single edges of the light receiving device regions 101 and 102, in the direction 191. In other words, the boundaries 313 and 314 can be at least a portion of each edge of a side in the direction 191 and a side opposite the direction 191 of the light receiving device regions 101 and 102. A width in the direction 191 of the light receiving device regions 101 and 102 is defined to be between the boundary 313 and the boundary 314. In addition, a width in the direction 192 may be defined between both boundaries of the element isolation regions 312 with edge portions in the direction 192 and the direction opposite the direction 192 of light receiving devices 110 arranged at respective edge portions in the direction 192 and the direction opposite the direction 192 respectively.

The light blocking portion 160 is arranged so as to cover the barrier regions 309 and the epitaxial layer 306, and has opening portions 317 above the light receiving devices 110, in other words above the regions 308 and the regions 307 that configure the light receiving devices 110. Accordingly, in an orthogonal projection with respect to the surface of the substrate 304, an outer edge of the opening portions 317 of the light blocking portion 160 can be an outer edge of respective light receiving devices 110. In addition, the virtual line 120 described above can pass through the outer edge 315 of, out of the opening portions 317, the opening portions 317 arranged above the outer edges on a side in the direction 191 of the light receiving devices 110 arranged at respective edge portions of the light receiving device regions 101 and 102, in the direction 191. Similarly, the virtual line 121 can pass through the outer edge 316 of, out of the opening portions 317, the opening portion 317 arranged above the outer edges on a side in a direction opposite the direction 191 of the light receiving devices 110 arranged at respective edge portions of the light receiving device regions 101 and 102, in a direction opposite the direction 191. Accordingly, a width in the direction 191 of the light receiving device regions 101 and 102 is defined to be between the outer edge 316 and the outer edge 315 of this opening portion 317. In addition, a width in the direction 192 may be defined between both outer edges of the opening portions 317 of the outer edges in the direction 192 and the direction opposite the direction 192 of light receiving devices 110 arranged at respective edge portions in the direction 192 and the direction opposite the direction 192 respectively.

Figure 4:
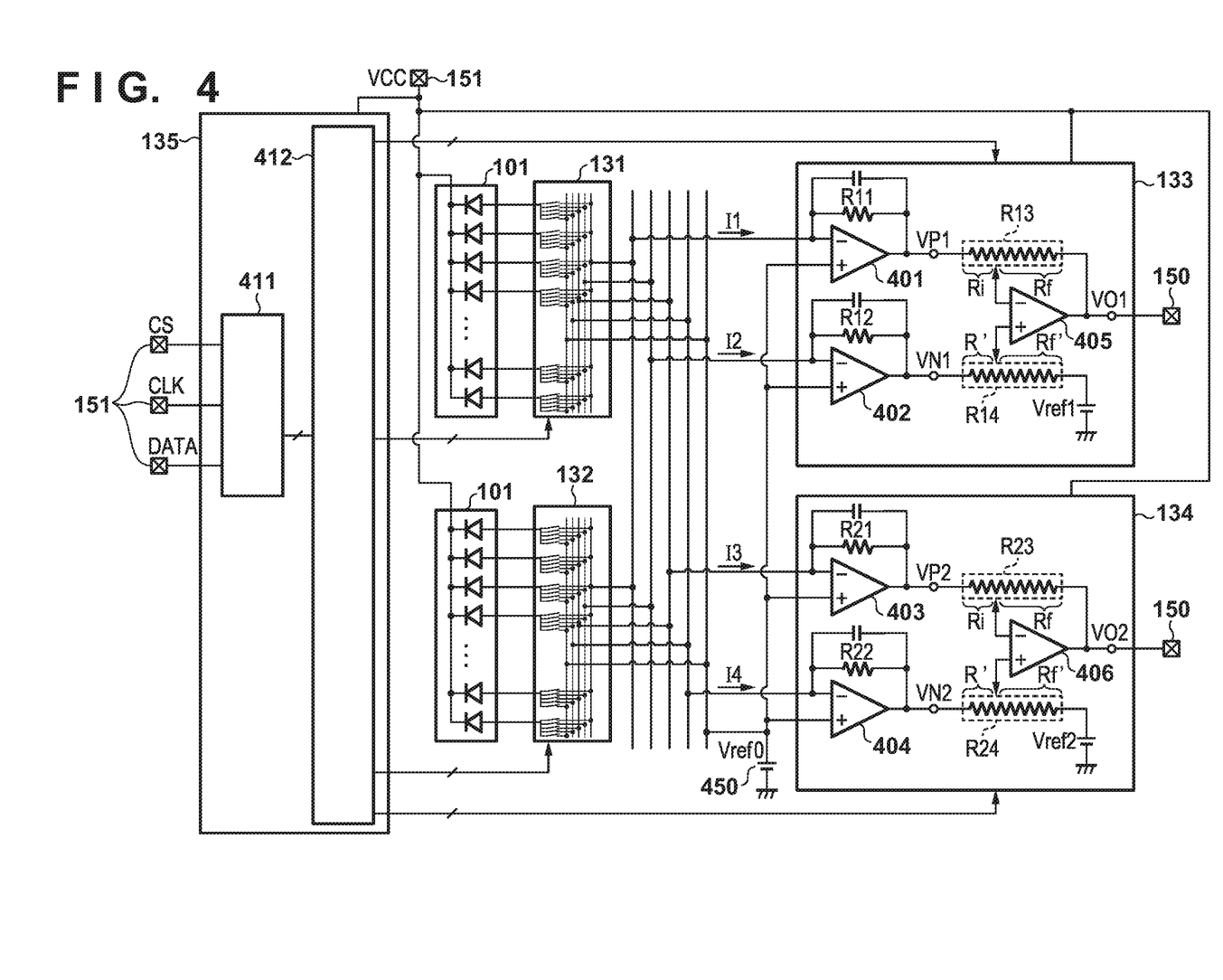
FIG. 4 is a view illustrating a circuit configuration of the photoelectric conversion apparatus of FIG. 1.

Next, an explanation using FIG. 4 is given for a circuit configuration of photoelectric conversion apparatus 100. The respective light receiving device regions 101 and 102 of the two light receiving device arrays 111 and 112 use power supplied via the electrode pads 151 as a power source, generate a photocurrent in accordance with an amount of light incident on the light receiving devices 110, and supply the photocurrent to the selection units 131 and 132 of the readout circuit 130. The selection unit 131 is arranged between the light receiving device region 101 and a reference voltage source 450 and the processing units 133 and 134 of the readout circuit 130, and in the light receiving device region 101, selects the light receiving devices 110 for outputting a photocurrent in accordance with a selecting signal inputted from the selecting unit 135 of the readout circuit 130. Similarly, the selection unit 132 is arranged between the light receiving device region 102, the reference voltage source 450 and the processing units 133 and 134, and in the light receiving device region 102, selects the light receiving devices 110 for outputting a photocurrent in accordance with a selecting signal inputted from the selecting unit 135. There are five selection patterns for the light receiving devices 110: whether respective light receiving devices are connected to one of current voltage conversion amplifiers 401 through 404 of the processing unit 133, and whether they are connected to none. When they are connected to none, the respective light receiving devices are connected to the reference voltage source 450. In a case of being connected to the current voltage conversion amplifier 401, a current I1 is outputted as a photocurrent obtained in accordance with a quantity of incident light and a number of selected light receiving devices 110. Similarly, in cases of being connected to the current voltage conversion amplifiers 402, 403, and 404, the currents I2, I3, and I4 are respectively outputted.

The processing unit 133 includes the current voltage conversion amplifiers 401 and 402 and a gain amplifier 405. For the current voltage conversion amplifier 401, a voltage Vref0 is supplied from the reference voltage source 450 to a non-inverting input terminal, and output from the selection units 131 and 132 and an integrating resistor R11 are respectively connected to an inverting input terminal. Output from an output terminal of the current voltage conversion amplifier 401 is fed back to the inverting input terminal via the integrating resistor R11. A voltage value of the inverting input terminal is connected to the voltage Vref0 in accordance with a virtual short with the non-inverting input terminal. A signal VP1 which is an output of the current voltage conversion amplifier 401 is converted to a voltage obtained by $Vref0-R11 \times I1$ in order to generate a voltage drop of a value resulting by multiplying the integrating resistor R11 with respect to the supplied current I1. Similarly in the current voltage conversion amplifier 402, a signal VN1 which is an output of the current voltage conversion amplifier 402 is converted to a voltage obtained by $VN1=Vref0-R12 \times I2$.

For the gain amplifier 405, the signal VP1 of the current voltage conversion amplifier 401 is connected to the inverting input terminal via a gain resistor R13, and the signal VN1 of the current voltage conversion amplifier 402 is connected to the non-inverting input terminal via a gain resistor R14. A signal VO1 which is an output of the gain amplifier 405 is fed back to the inverting input terminal of the gain amplifier 405 via the gain resistor R13. In addition, a voltage Vref1 is connected to the inverting input terminal of the gain amplifier 405 via the gain resistor R14.

The gain resistors R13 and R14 may be variable resistors as in the configuration illustrated in FIG. 4. By this, in the gain resistor R13, it is possible to variable control the values of a resistance component Rf between the signal VO1 and the inverting input terminal of the gain amplifier 405, and a resistance component Ri between the signal VP1 and the inverting input terminal of the gain amplifier 405. In addition, similarly in the gain resistor R14, it is possible to variably control values of a resistance component Rf' between the signal VO1, the input signal VN1 and the non-inverting input terminal of the gain amplifier 405, and a resistance component Ri' between the signal VN1 and the non-inverting input terminal of the gain amplifier 405. Here, in a case where respective resistance components are set with Ri=Ri' and Rf=Rf', the signal VO1 outputted from the gain amplifier 405 is obtained by $VO1=Rf/Ri \times (VN1-VP1)+Vref1$. Furthermore, in a case were the values of the integrating resistors R11 and R12 are set with R11=R12=Riv, the signal VO1 becomes $VO1=Rf/Ri \times Riv \times (I1-I2)+Vref1$. In this fashion, the processing unit 133 converts into voltages and amplifies the currents I1 and I2 that are in accordance with incident light, and outputs from the electrode pads 150. Similarly, the processing unit 134 converts and amplifies the currents I3 and I4 outputted from the selection units 131 and 132 into a voltage signal VO2 in accordance with the values of the currents I3 and I4, and outputs via the electrode pads 150. Similarly to the above, if the variable resistor resistance components of the gain resistors R23 and R24 are set with Ri=Ri' and Rf=Rf' and the values of the integrating resistors R21 and R22 are set with R21=R22=Riv, the signal VO2 becomes $VO2=Rf/Ri \times Riv \times (I3-I4)+Vref1$.

The selecting unit 135 includes a communication unit 411 and a storage unit 412. The selecting unit 135 supplies the selection units 131 and 132 with a selecting signal for the selection units 131 and 132 to select light receiving devices 110 for outputting signals out of the two light receiving device regions 101 and 102. In addition, the selecting unit 135 supplies the processing units 133 and 134 with a selecting signal for adjusting gains of the gain amplifiers 405 and 406 of the processing units 133 and 134. The communication unit 411 is configured by a three line serial communication circuit: chip select (CS), serial clock (CLK), and serial data (DATA), for example, and receives selecting data from a communication controller (not shown) via the electrode pads 151. The received data is sent to the storage unit 412 from the communication unit 411. The storage unit 412 is configured by registers, for example, stores selecting data sent from the communication unit 411, and respectively outputs selecting signals in accordance with selecting data to the selection units 131 and 132 and the processing units 133 and 134. In the present embodiment, the communication unit 411 uses a three line serial communication scheme, but may use a two line communication scheme that supports an I2C (Inter-Integrated Circuit) bus. In addition, the storage unit 412 is registers, but may be a volatile memory such as an SRAM, or a non-volatile memory such as a ROM.

Figure 5:
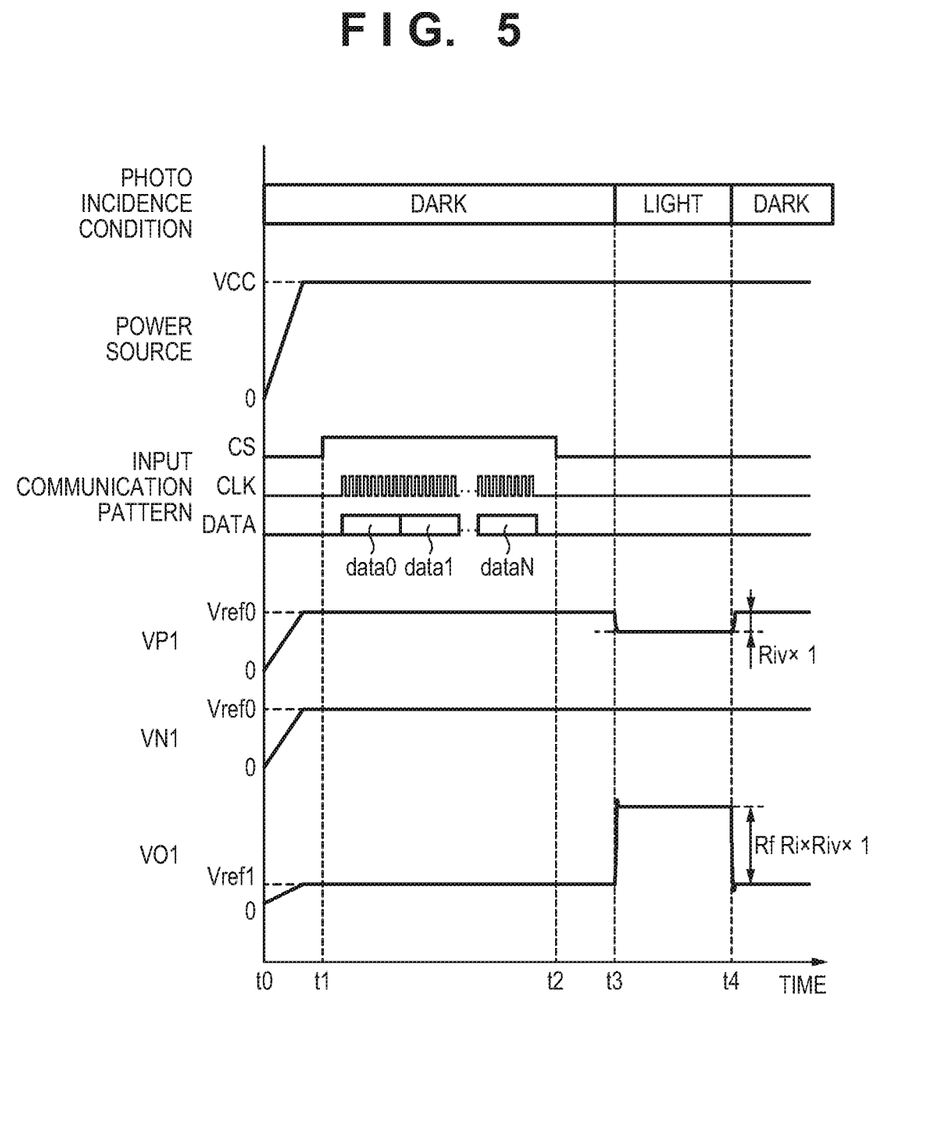
FIG. 5 is an operation timing diagram of the photoelectric conversion apparatus of FIG. 1.

Next, explanation is given regarding operation of the photoelectric conversion apparatus 100. FIG. 5 is an operation timing diagram illustrating an example of operation of the photoelectric conversion apparatus 100. A photo incidence condition indicates a dark state (DARK) which is a period when light is not incident on the photoelectric conversion apparatus 100, and a photo incidence state which is a period when light is incident. Power source indicates off (0) and on (VCC) for the power source of the photoelectric conversion apparatus 100. The signals CS, CLK, and DATA indicate communication patterns for chip select (CS), serial clock (CLK), and serial data (DATA), respectively, which are inputted to the communication unit 411. The signals VP1, VN1, and VO1 indicate respective outputs of the current voltage conversion amplifiers 401 and 402, and the gain amplifier 405 in the processing unit 133 described above.

Firstly, at a time to, a power source is supplied to the photoelectric conversion apparatus 100, and the signal VP1 and the signal VN1 increase to the voltage Vref0, and the signal VO1 increases to the reference voltage Vref1. Next, from a time t1 to a time t2, the communication unit 411 communication with an external communication controller of the photoelectric conversion apparatus 100 via the electrode pads 151. In accordance with the signal CS (the chip select signal) changing from an off (Low) state to an on (High) state, the communication unit 411 enters a state of being able to receive a signal from outside. When the communication unit 411 enters the state of being able to receive signals, the selecting unit 135 successively captures values (data0, data1, . . . , dataN) for the signal DATA (the serial data signal) in accordance with a rising edge or a falling edge of the signal CLK (the serial clock signal). In accordance with the capture value of the signal DATA, the selecting unit 135 performs selecting of the selection units 131 and 132 and the processing units 133 and 134 via the storage unit 412. In the selecting example illustrated in FIG. 5, selecting of the selection units 131 and 132 is performed so that the light signals I1 and I2 respectively are I1>0 and I2=0. Next, upon entering the photo incidence state at a time t3, the signal VP1 which is the output of the current voltage conversion amplifier 401 decreases from the voltage Vref0 in accordance with the photocurrent I1 generated in accordance with incident light. In conjunction with this, the signal VO1 which is the output of the gain amplifier 405 increases from the voltage Vref1. Subsequently, upon entering the dark state at a time t4, the signal VP1 returns to the voltage Vref0, and the signal VO1 returns to the voltage Vref1.

Here, a case where respective light receiving devices of the light receiving device regions 101 and 102 are photodiodes is considered. For voltages applied to both terminals of a photodiode, an anode side is the external power source which is connected via the electrode pads 151, and a cathode side is the voltage Vref0 which is connected via the selection units 131 and 132. In addition, the light receiving device includes a pn junction capacitance in accordance with the p+ type regions 307 and the n type regions 308 illustrated in FIGS. 3A, 3B. A reverse voltage applied to both terminals of a light receiving device 110 may be increased in order to increase a light response of the light receiving device. For example, the voltage Vref0 may be set to less than or equal to ½ of the external power source. However, in a case where fluctuation occurs in the power source voltage, when the reverse voltage is applied to the light receiving device, a current having fluctuation in accordance with the pn junction capacitance is generated as noise. The photoelectric conversion apparatus 100, via the processing units 133 and 134, amplifies this noise and outputs it. In order to suppress fluctuation of the power source voltage as much as possible, there is a necessity to consider arrangement of pads for supplying power, such as to avoid crosstalk that occurs due to change in output from the readout circuit 130. For example, out of the electrode pads 150 and 151, a power supply pad for supplying power to the photoelectric conversion apparatus 100 and an output pad for outputting a signal from the processing units 133 and 134 of the readout circuit 130 may be respectively arranged separately on both ends in the direction 191 of the photoelectric conversion apparatus 100. In the configuration illustrated in FIG. 1, the processing units 133 and 134 of the readout circuit 130 are arranged on a side where the output pad, out of the electrode pads 150 and 151, for outputting signals is arranged (a side of the electrode pads 150). In addition, the selecting unit 135 of the readout circuit 130 is arranged on a side where a power supply pad, out of the electrode pads 150 and 151, for supplying power from the external power source is arranged (a side of the electrode pads 151). By this, it is possible to improve the stability of power source and reduce noise of a signal outputted from the photoelectric conversion apparatus 100.

In the present embodiment, the readout circuit 130 has a current voltage conversion type circuit configuration that uses the integrating resistors R11, R12, R21, and R22. However, the circuit configuration is not limited to this, and the readout circuit 130 may have a charge transfer type circuit configuration typically used in an image sensor or a linear sensor.

Figure 6:
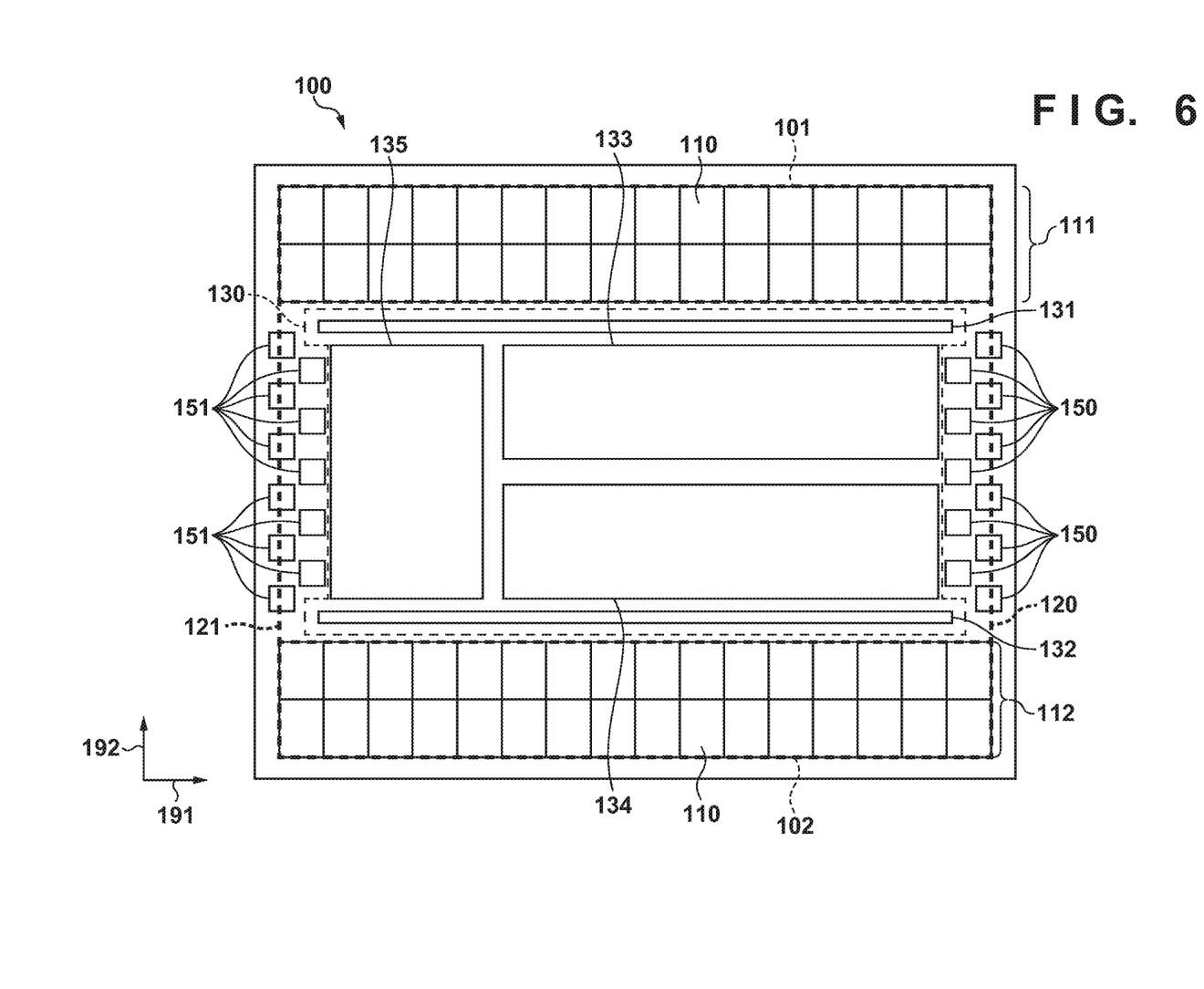
FIG. 6 is a plan view illustrating a variation of the photoelectric conversion apparatus of FIG. 1.

In addition, in the configuration illustrated in FIG. 1, the plurality of electrode pads 150 and 151 are respectively arranged, with a single column in the direction 191, following the direction 192 at both ends of the photoelectric conversion apparatus 100 in the direction 191. However, the arrangement of the electrode pads 150 and 151 is not limited to this. For example, the electrode pads 150 and 151 may be arranged with two columns in the direction 191, as illustrated in FIG. 6. By increasing the arrangement of the electrode pads 150 and 151 to two columns, it is possible to arrange more electrode pads with the same chip size. With the configuration illustrated in FIG. 6, in the photoelectric conversion apparatus 100, eleven of the electrode pads 150 and 151 have a staggered arrangement on respectively a side of an edge portion in the direction 191 of the readout circuit 130, and a side of an edge portion in a direction opposite to the direction 191. By this, in the photoelectric conversion apparatus 100 which has the same chip size as the configuration illustrated in FIG. 1, it is possible to arrange more electrode pads.

Figure 7:
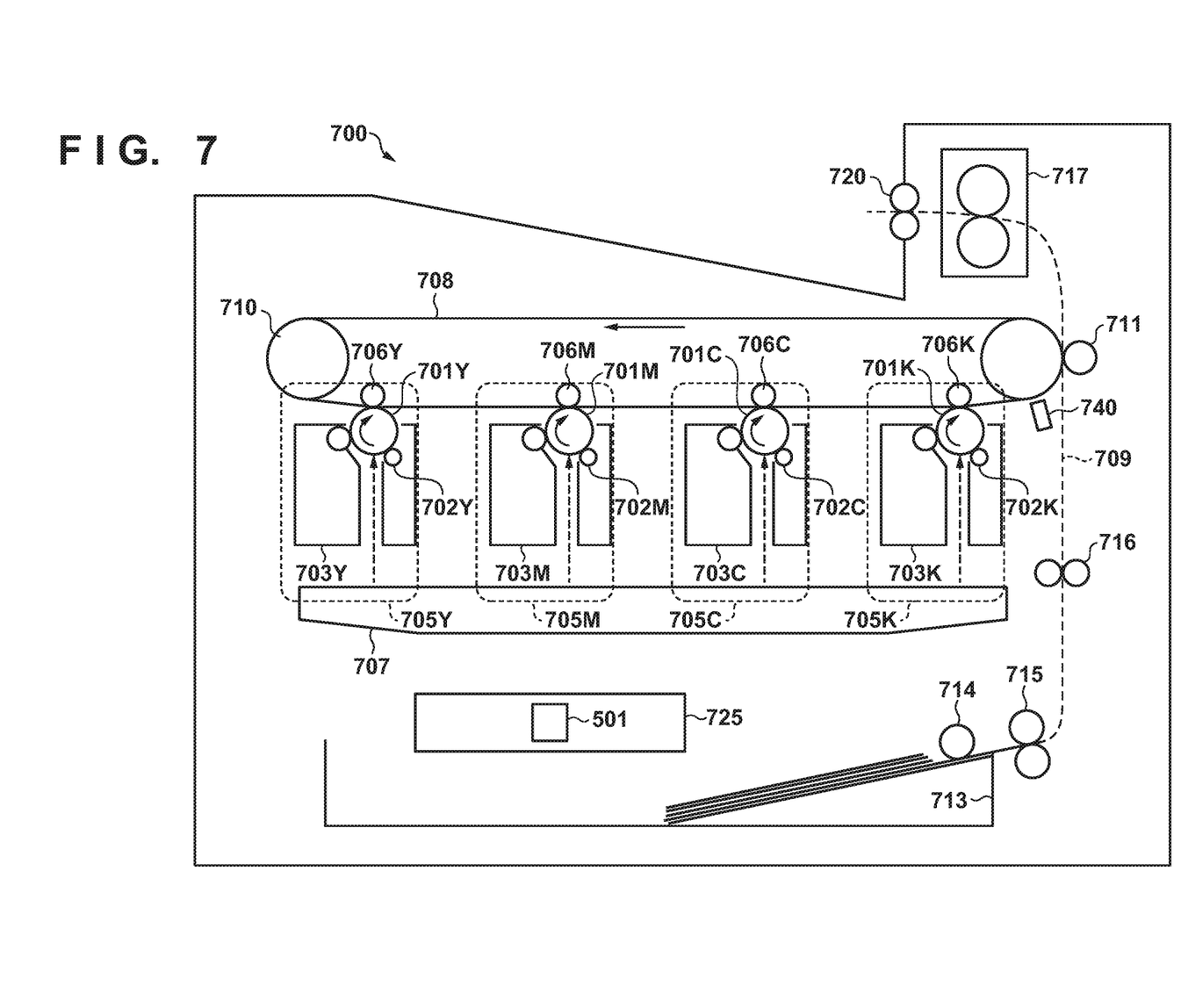
FIG. 7 is a view illustrating an example of a configuration of an image forming apparatus equipped with a sensor unit that includes the photoelectric conversion apparatus of FIG. 1.
Figure 8:
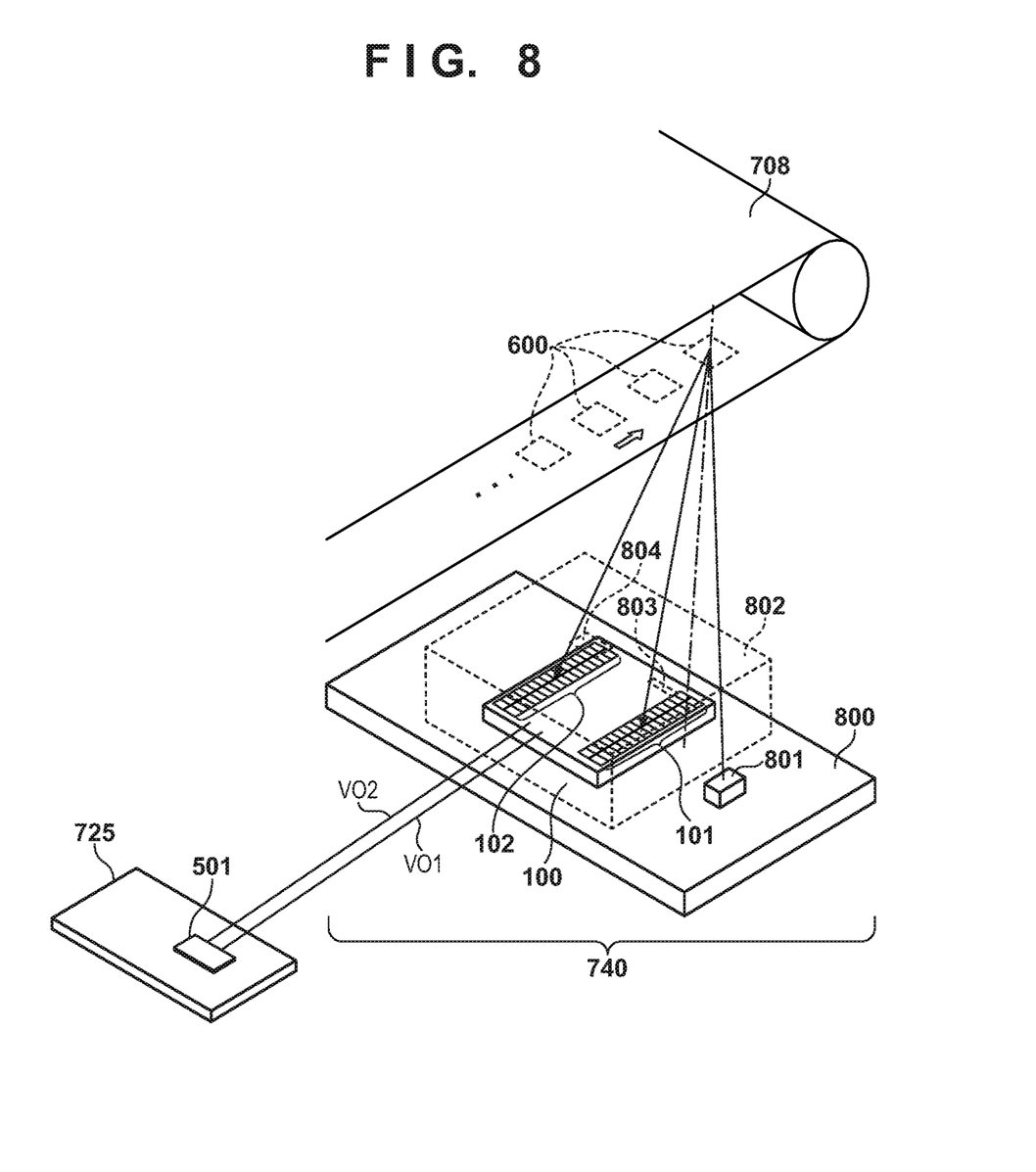
FIG. 8 is a view illustrating a relationship between the sensor unit that includes the photoelectric conversion apparatus of FIG. 1, a test image, and a controller.

Next, using FIGS. 7 and 8, explanation is given regarding a sensor unit for detecting color misregistration that is provided with the photoelectric conversion apparatus 100, and an image forming apparatus provided with the sensor unit, as an application of the photoelectric conversion apparatus 100 described above.

FIG. 7 is a view illustrating a configuration of a tandem type image forming apparatus 700 for forming a color image. Y, M, C, and K at the end of reference numerals of FIG. 7 respectively indicate that the color of a developing agent (toner), which is the subject of a corresponding member, is yellow, magenta, cyan, or black. In the following explanation, in a case where there is no need to distinguish colors, reference numerals that omit Y, M, C, or K from the end are used. A charging unit 702 uniformly charges a photosensitive drum 701 which is an image carrier that is rotationally driven in a direction of the arrow symbol in the figure. An exposure unit 707 irradiates a laser beam onto the photosensitive drum 701 to form an electrostatic latent image on the photosensitive drum 701. A developing unit 703 supplies toner that is a developing agent to the electrostatic latent image, and makes the electrostatic latent image be a toner image which is a visible image, by applying a developing bias. A primary transfer roller 706 transfers the toner image of the photosensitive drum 701 in accordance with a primary transfer bias to an intermediate transfer belt 708. The charging unit 702 through to the primary transfer roller 706 above are configured as an image forming unit 705. Note that the intermediate transfer belt 708 for conveying a toner image is rotated by a driving roller 710. A color image is formed by a photosensitive drum 701Y, a photosensitive drum 701M, a photosensitive drum 701C, and a photosensitive drum 701K successively overlapping and transferring toner images onto the intermediate transfer belt 708.

Conveyance rollers 714 and 715 conveys a recording material from within a cassette 713 to a secondary transfer roller 711 following a conveyance path 709. The secondary transfer roller 711 transfers the toner image of the intermediate transfer belt 708 to the recording material in accordance with a secondary transfer bias. The recording material to which the toner image has been transferred is heated and pressurized at a fixing unit 717 to perform fixing of the toner image, and is discharged outside of the image forming apparatus 700 by a conveyance roller 720. An engine control unit 725 is mounted with a microcontroller (a controller 501), and performs various control that uses a sensor, sequence control of various driving sources (not illustrated) of the image forming apparatus 700, or the like. Furthermore, the engine control unit 725 also handles a test image generation function for generating a test image and outputting it to the image forming unit 705 described above. In addition, a sensor unit 740 for detecting an amount of color misregistration at a position facing the intermediate transfer belt 708 is provided in the image forming apparatus 700.

In the tandem type image forming apparatus 700, there are cases where a tint, a density, or the like of a color image outputted changes in accordance with continuous printing or temporal change. Density control is performed in order to correct such fluctuation. In density control, a detection image for detecting a density of each color is formed on the intermediate transfer belt 708, and a formed image density is detected by the sensor unit 740 which is for color misregistration detection. For density detection by the sensor unit 740, a method in which a test image is irradiated by a light source and an intensity of reflected light is detected by a light receiving device is typical. A signal corresponding to the intensity of reflected light is processed by the controller 501 of the engine control unit 725, and halftone tone characteristics or a maximum density of each color is corrected by feeding back to process forming conditions such as power of the laser beam and various voltage conditions. Control of the maximum density has a purpose of maintaining a fixed color balance for each color, preventing scattering of images of overlapping colors due to excessive application of toner, and preventing defective fixing. Meanwhile, tone control of halftones has a purpose of preventing an inability to form a natural image whose output density is shifted from an input image signal in accordance with non-linear input-output characteristics.

FIG. 8 is a perspective view illustrating a relationship between the sensor unit 740, test images 600, and the controller 501 of the engine control unit 725. For the test images 600, a plurality of rectangular shape toner images are formed along a movement direction of the intermediate transfer belt 708, for example. The sensor unit 740 includes a light emitting device 801 arranged on a package substrate 800, the photoelectric conversion apparatus 100 described above, and a narrow down member 802. Conventionally, function of the photoelectric conversion apparatus 100 is achieved by a configuration that uses discrete components, such as light receiving devices configured by phototransistors and a circuit for processing signals detected by the light receiving devices. Accordingly, the sensor unit suffers an increase in size accompanying allocation of the area of the package substrate 800. In the present embodiment, because the sensor unit 740 is configured by the light emitting device 801 and the photoelectric conversion apparatus 100 on the package substrate 800, it becomes possible to miniaturize to a size that is a fraction of the sensor unit 740 in comparison to a conventional configuration that uses discrete components.

The light emitting device 801 emits light that the photoelectric conversion apparatus 100 is caused to receive, is configured by an LED chip for example, and irradiates a diverging light beam onto the intermediate transfer belt 708. The reflected light, which is emitted from the light emitting device 801 and reflected by the intermediate transfer belt 708, is incident on the two light receiving device regions 101 and 102 of the photoelectric conversion apparatus 100 via opening portions 803 and 804 provided in the narrow down member 802 for focusing or narrowing the reflected light.

The density control may make a detection in accordance with monitoring of a specular reflection light component. However, because the image forming apparatus 700 of the present embodiment uses toner of four colors, absorption/reflection characteristics of light differs in accordance with toner color. For example, in a case where the light emitted by the light emitting device 801 is infrared light, black toner will substantially absorb the light, and toner of the other colors will scatter and reflect the light. In addition, for example, in a case where the light emitted by the light emitting device 801 is red light, black and cyan toner will substantially absorb the light, and toner of the other colors will scatter and reflect the light. In other words, in a state where toner having a high amount of scattering and reflection and toner having a low amount of scattering and reflection (or toner that hardly scatters or reflects) are mixed, it is necessary to perform processing for removing a scattered light component in accordance with the test images 600. Accordingly, in the density control, there is a need to separately provide the opening portion 803 for detecting a specular reflection component and the opening portion 804 for detecting a scattering reflected light component, in the narrow down member 802.

The photoelectric conversion apparatus 100 which receives the specular reflection light component and the scattering reflected light component by the respective light receiving device regions 101 and 102 of the two light receiving device arrays 111 and 112 outputs the signals VO1 and VO2 in accordance with the incident amounts of light to the controller 501, as described above. The controller 501 determines the density of the test images 600 by performing calculation processing based on respective signal levels of the specular reflection light component and the scattering reflected light component. By this, it is possible to detect color misregistration, perform density control, and correct halftone tone characteristics or a maximum density of each color.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-038679, filed Mar. 1, 2017, which is hereby incorporated by reference wherein in its entirety.

What is claimed is:

1. A photoelectric conversion apparatus, comprising:
a substrate including two light receiving device regions in each of which a plurality of light receiving devices are respectively arranged;
a plurality of electrode pads arranged on the substrate; and
a readout circuit arranged on the substrate and configured to read out signals from the two light receiving device regions,
wherein the plurality of electrode pads include an output pad for outputting a signal from the readout circuit, and a power supply pad for supplying power to the two light receiving device regions or the readout circuit, each of the two light receiving device regions has a shape in which a first direction is taken as a longitudinal direction, the two light receiving device regions are arranged along a second direction with an interval therebetween, the second direction intersecting the first direction, and one or more electrode pads of the plurality of electrode pads is sandwiched by the two light receiving device regions in the second direction.

2. The photoelectric conversion apparatus according to claim 1, wherein, at least a portion of the one or more electrode pads is arranged, in the first direction, between a first virtual line connecting first edges on the same side in the longitudinal direction of the two light receiving device regions to each other and a second virtual line connecting second edges opposite to the first edges in the longitudinal direction of the two light receiving device regions to each other.

3. The photoelectric conversion apparatus according to claim 2, wherein the first virtual line connects outer edges of two light receiving devices, out of the plurality of light receiving devices, arranged closest to the first edge of the two light receiving device regions to each other, and the second virtual line connects outer edges of two light receiving devices, out of the plurality of light receiving devices, arranged closest to the second edge of the two light receiving device regions to each other.

4. The photoelectric conversion apparatus according to claim 2, wherein respective light receiving devices of the plurality of light receiving devices are electrically separated by an element isolation region, respective ones of the plurality of light receiving devices includes a semiconductor region arranged in an active region defined by the element isolation region, and a boundary between the active region and the element isolation region is at least a part of the first edge and the second edge of the two light receiving device regions.

5. The photoelectric conversion apparatus according to claim 3, wherein the photoelectric conversion apparatus further comprises a light blocking portion that covers the substrate, and the light blocking portion has respective opening portions above the plurality of light receiving devices, and in an orthogonal projection with respect to a surface of the substrate, outer edges of the opening portions are outer edges of respective light receiving devices of the plurality of light receiving devices.

6. The photoelectric conversion apparatus according to claim 1, wherein the readout circuit is arranged within a region sandwiched by the two light receiving device regions, and the plurality of electrode pads are arranged on at least one of a first side in the longitudinal direction viewed from the readout circuit and a second side which is opposite to the first side in the longitudinal direction.

7. The photoelectric conversion apparatus according to claim 6, wherein the plurality of electrode pads are lined up along the second direction.

8. The photoelectric conversion apparatus according to claim 7, wherein the plurality of electrode pads are lined up following the second direction with one column or two columns in the first direction.

9. The photoelectric conversion apparatus according to claim 6, wherein the output pad is arranged on the first side, and the power supply pad is arranged on the second side.

10. The photoelectric conversion apparatus according to claim 1, wherein the readout circuit comprises a processing unit configured to process a signal outputted from the two light receiving device regions, and a selecting unit configured to select a light receiving device, out of the plurality of light receiving devices respectively arranged in the two light receiving device regions, to cause to output a signal.

11. The photoelectric conversion apparatus according to claim 1, wherein the output pad is arranged on a first side in the longitudinal direction viewed from the readout circuit, and the power supply pad is arranged on a second side which is opposite to the first side in the longitudinal direction viewed from the readout circuit, and the readout circuit comprises a processing unit configured to process signals outputted from the two light receiving device regions, and a selecting unit configured to select a light receiving device to output a signal, out of the plurality of light receiving devices respectively arranged in the two light receiving device regions, wherein, in the readout circuit, the processing unit is arranged closer to the output pad than the selecting unit is, and the selecting unit is arranged closer to the power supply pad than the processing unit is.

12. The photoelectric conversion apparatus according to claim 1, wherein in each of the two light receiving device regions, the plurality of light receiving devices are arranged in a two-dimensional array shape.

13. A photoelectric conversion apparatus, comprising:

a plurality of first photoelectric conversion units arranged to form a first column along a line in a first direction;

a plurality of second photoelectric conversion units arranged to form a second column along a line in the first direction;

a readout circuit arranged, in a second direction that intersects the first direction, between the second column and the first column which are arranged in the second direction and configured to read out signals from the plurality of first photoelectric conversion units and signals from the plurality of second photoelectric conversion units; and a plurality of electrode pads arranged, in the second direction, between the first column and the second column, wherein a virtual line connecting any one of the plurality of first photoelectric conversion units and any one of the plurality of second photoelectric conversion units passes through one or more of the plurality of electrode pads.

14. The photoelectric conversion apparatus according to claim 13, wherein the virtual line connects the first photoelectric conversion unit arranged at one edge of the first column, and the second photoelectric conversion unit arranged at an edge on the same side as the one edge, in the plurality of the second column.

15. The photoelectric conversion apparatus according to claim 13, wherein portions of one or more of the plurality of electrode pads are arranged, in the second direction, between the first column and the second column, so that the one or more of the plurality of electrode pads is divided into two portions by the virtual line.

16. The photoelectric conversion apparatus according to claim 13, wherein
the plurality of electrode pads includes an output pad for outputting a signal from the readout circuit, and a power supply pad for supplying power to the readout circuit, the plurality of first photoelectric conversion units or the plurality of second photoelectric conversion units.

17. The photoelectric conversion apparatus according to claim 13,
comprising a substrate in which the plurality of first photoelectric conversion units and the plurality of second photoelectric conversion units are arranged,
wherein the substrate comprises an active region in which the plurality of first photoelectric conversion units and the plurality of second photoelectric conversion units are arranged, and an isolation region that defines the active region.

18. A sensor unit comprising the photoelectric conversion apparatus according to claim 1, and a light emission device configured to emit light received by the photoelectric conversion apparatus.

19. An image forming apparatus comprising the sensor unit recited in claim 18, and a controller configured to process a signal outputted from the sensor unit.

* * * * *